(12) United States Patent
Fang et al.

(10) Patent No.: US 8,501,570 B2
(45) Date of Patent: Aug. 6, 2013

(54) METHOD OF MANUFACTURING SOURCE/DRAIN STRUCTURES

(75) Inventors: Ziwei Fang, Hsinchu (TW); Jeff J. Xu, Jhubei (TW); Ming-Jie Huang, Hsinchu (TW); Yimin Huang, Hsinchu (TW); Zhiqiang Wu, Chubei (TW); Min Cao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 12/981,610

(22) Filed: Dec. 30, 2010

(65) Prior Publication Data

US 2012/0100681 A1    Apr. 26, 2012

Related U.S. Application Data

(60) Provisional application No. 61/405,007, filed on Oct. 20, 2010.

(51) Int. Cl.
*H01L 21/02* (2006.01)
*H01L 21/306* (2006.01)
*H01L 29/165* (2006.01)
*H01L 29/66* (2006.01)
*H01L 29/78* (2006.01)
*H01L 21/265* (2006.01)

(52) U.S. Cl.
USPC ........... 438/305; 438/506; 438/701; 438/504; 438/306; 438/529; 438/530; 438/528; 257/19; 257/20; 257/65; 257/66

(58) Field of Classification Search
USPC ................. 438/231, 232, 299, 300, 301, 303, 438/305, 306, 307, 519, 521, 527, 734, 735, 438/FOR. 217, 478, 503, 504, 505, 506, 507, 438/508, 509, 700, 701; 257/E21.431, E21.433, 257/E21.434, E21.454, E21.619, E21.62, 257/E21.634, E21.644
See application file for complete search history.

(56) References Cited

U.S. PATENT DOCUMENTS

| | | | | |
|---|---|---|---|---|
| 5,834,797 | A * | 11/1998 | Yamanaka | 257/57 |
| 6,514,839 | B1 * | 2/2003 | Ker et al. | 438/514 |
| 2005/0148147 | A1 * | 7/2005 | Keating et al. | 438/299 |
| 2005/0215024 | A1 * | 9/2005 | Nahm et al. | 438/420 |

\* cited by examiner

*Primary Examiner* — Olik Chaudhuri
*Assistant Examiner* — Quovaunda V Jefferson
(74) *Attorney, Agent, or Firm* — Slater & Matsil, L.L.P.

(57) ABSTRACT

An integrated circuit device and method for manufacturing the integrated circuit device provide improved control over a shape of a trench for forming the source and drain features of integrated circuit device, by forming a second doped region in a first doped region and removing the first and the second doped regions by a first and a second wet etching processes.

25 Claims, 10 Drawing Sheets

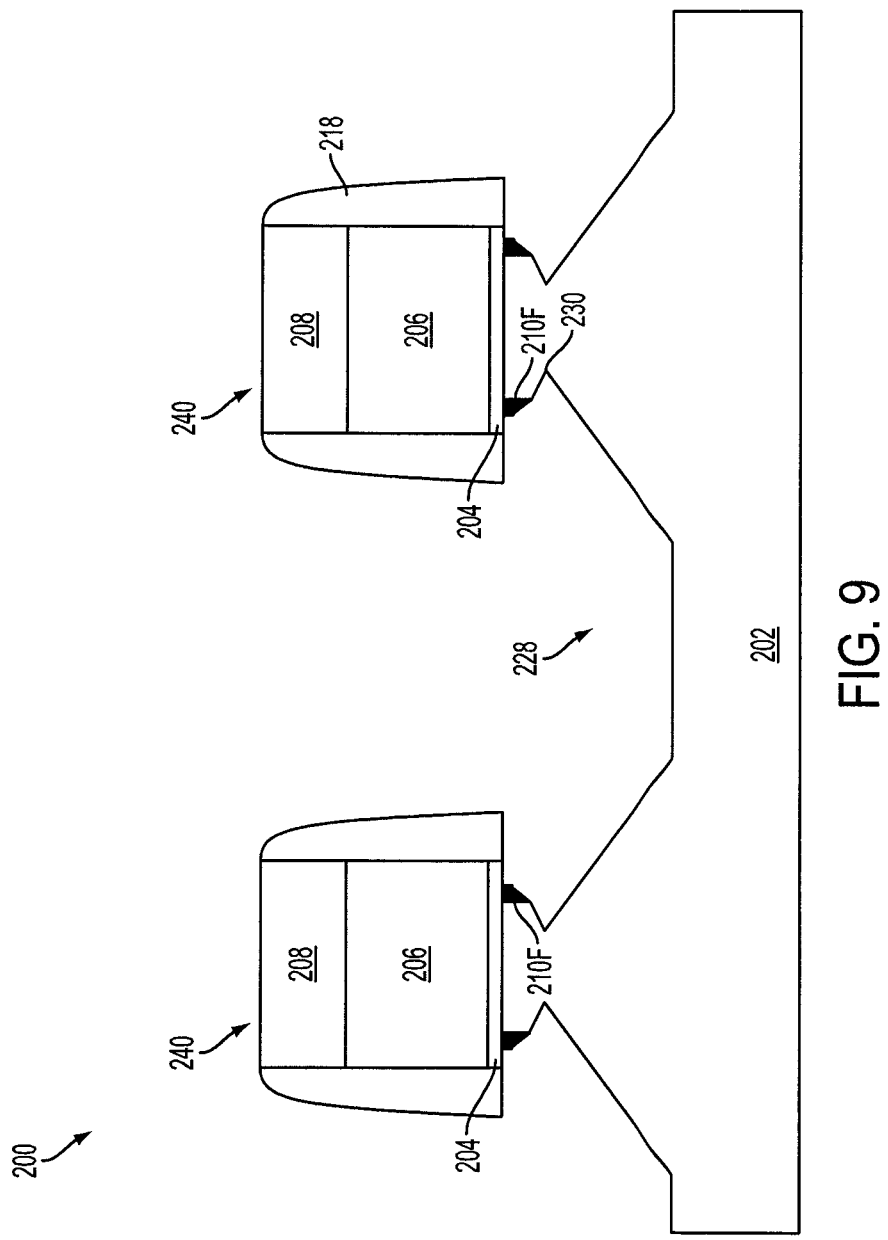

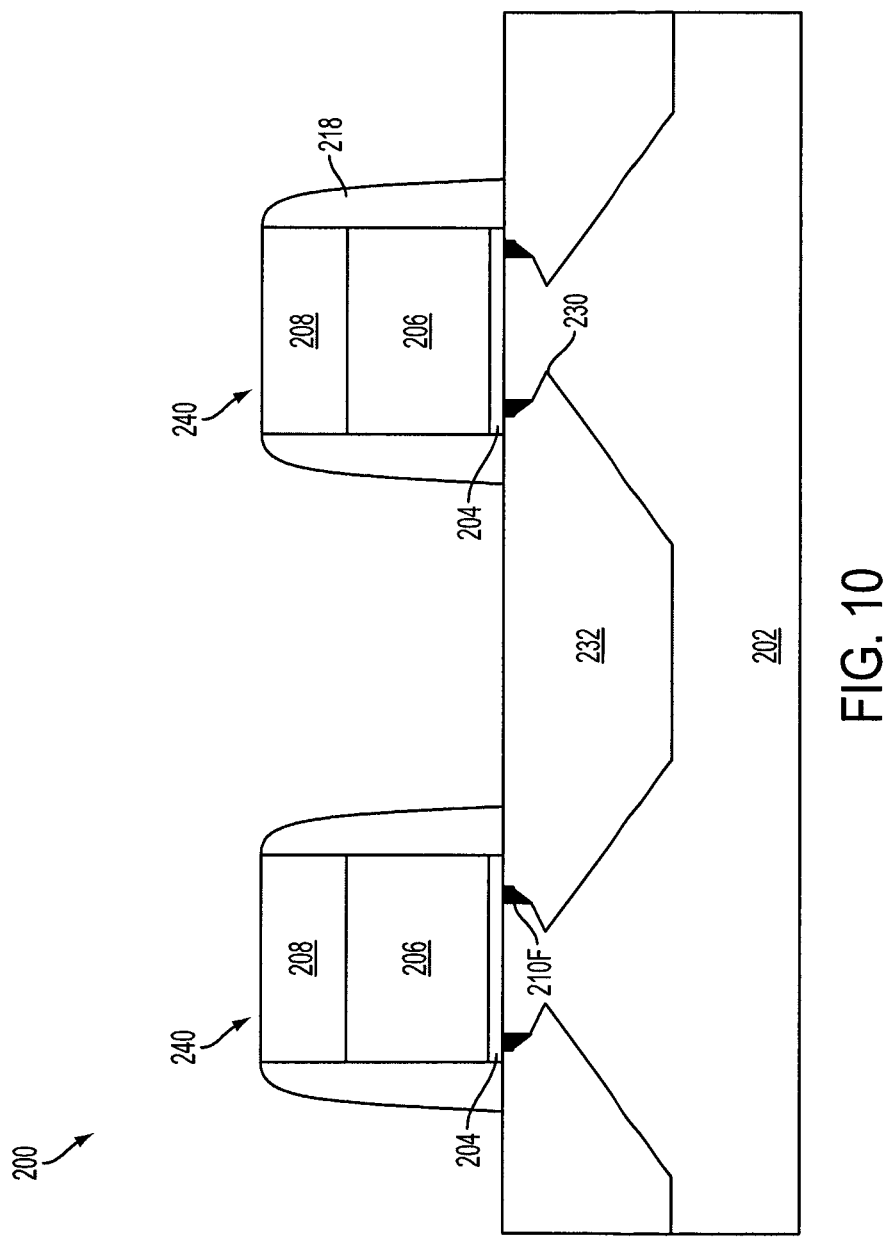

US 8,501,570 B2

METHOD OF MANUFACTURING SOURCE/DRAIN STRUCTURES

CROSS REFERENCE

The present application claims priority of U.S. Provisional Patent Application Ser. No. 61/405,007, filed on Oct. 20, 2010, which is incorporated herein by reference in its entirety.

The present disclosure is related to the following commonly-assigned U.S. patent application, the entire disclosure of which is incorporated herein by reference: U.S. application Ser. No. 12/816,519 for "INTEGRATED CIRCUIT DEVICE WITH WELL CONTROLLED SURFACE PROXIMITY AND METHOD OF MANUFACTURING SAME".

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to try and further improve transistor device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-10 are various diagrammatic cross-sectional views of an integrated circuit device in accordance with one or more embodiments during various fabrication stages according to the method of FIG. 1.

DETAILED DESCRIPTION

Figure 1:
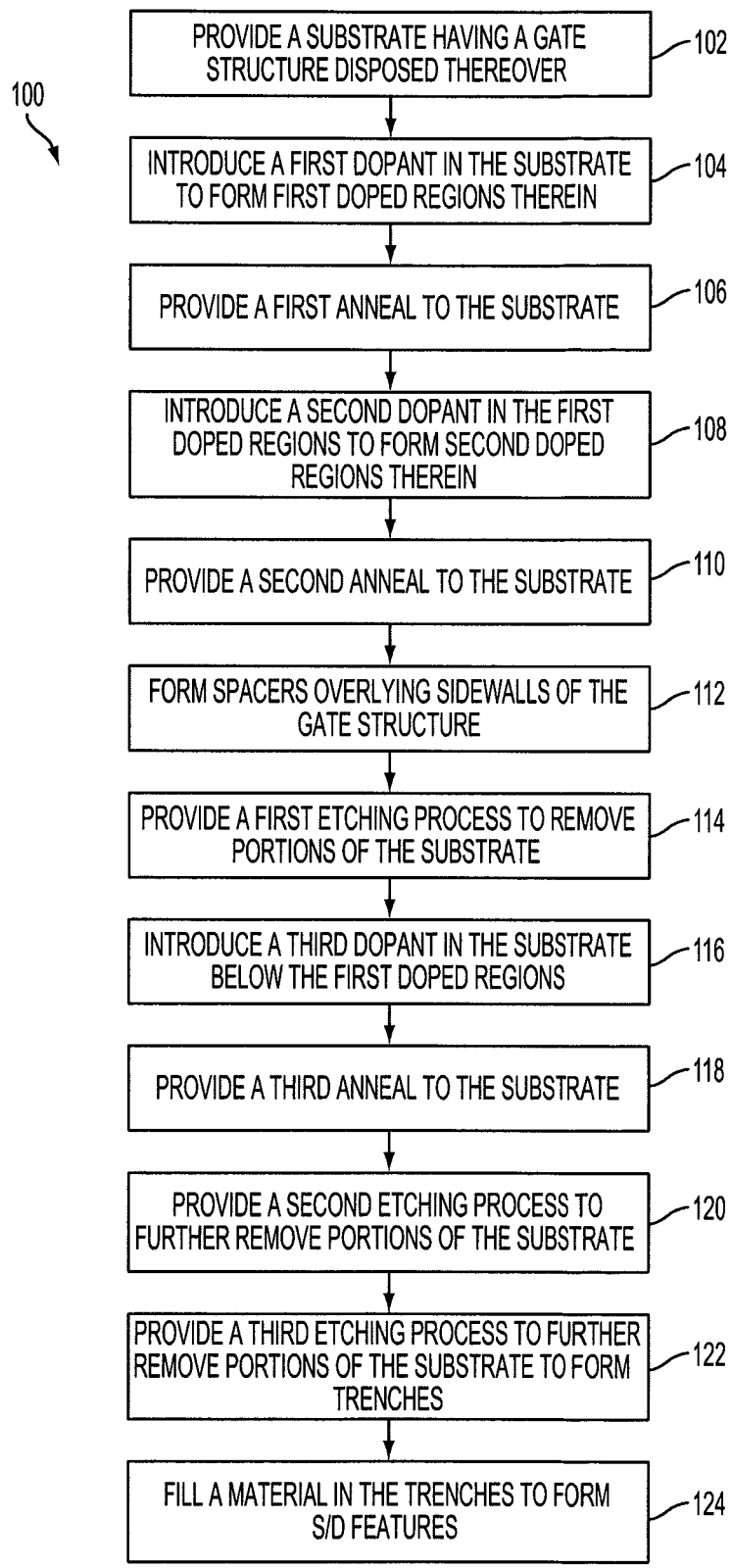
FIG. 1 is a flow chart of a method for fabricating an integrated circuit device according to one or more embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-10, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can switch place or be replaced or eliminated, for additional embodiments of the method. It is further understood that additional features can be added in the semiconductor device 200, and some of the features described below can be replaced or eliminated, for additional embodiments of the semiconductor device 200.

Figure 2:
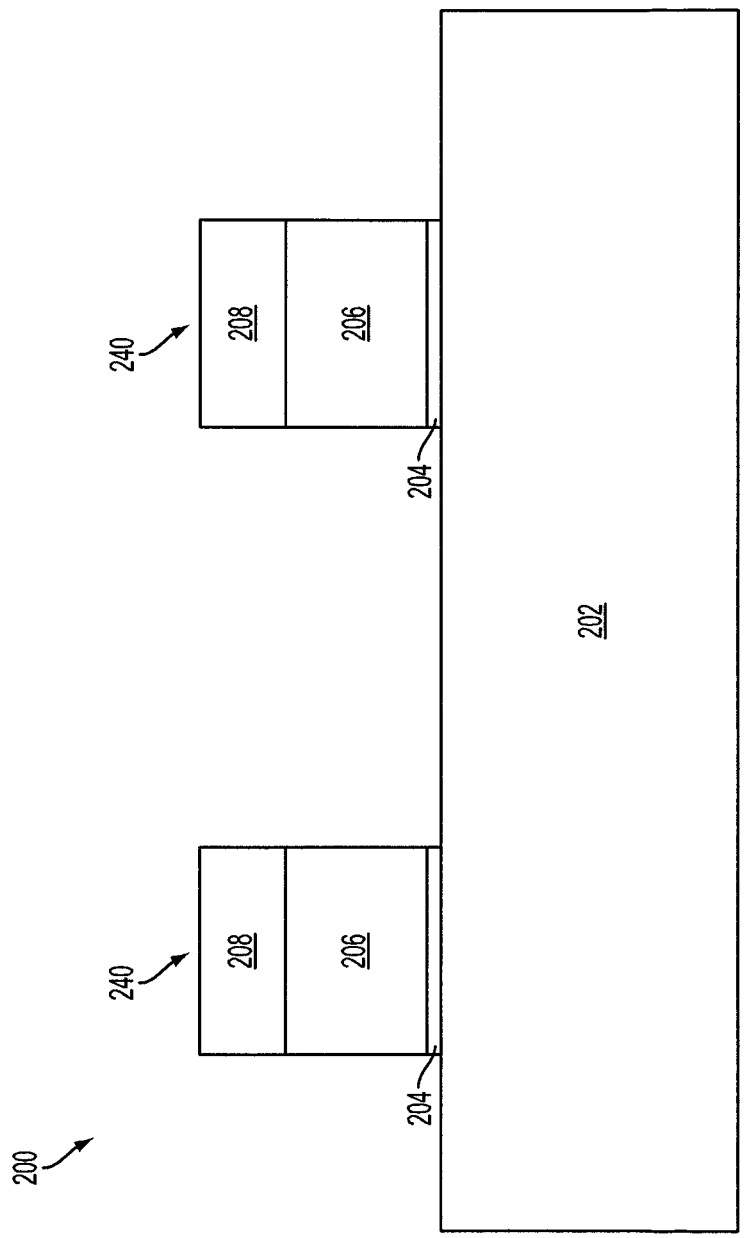

Referring to FIGS. 1 and 2, the method 100 begins at step 102 wherein a substrate 202 is provided. In the present embodiment, the substrate 202 is a semiconductor substrate comprising silicon. Alternatively, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 202 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 202, in a P-well structure, in a N-well structure, in a dual-well structure, or using a raised structure. The semiconductor device 200 may include a NFET device and/or a PFET device, and thus, the substrate 202 may include various doped regions configured for a particular device in each of the NFET device and/or the PFET device.

Gate structures 240 are formed over the substrate 202. In some embodiments, the gate structures 240 include, in order, a gate dielectric 204, a gate electrode 206, and a hard mask 208. The gate structures 240 may be formed by deposition, lithography patterning, and etching processes.

The gate dielectric 204 is formed over the substrate 202 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric 204 may be a multilayer structure, for example, including an interfacial layer, and a high-k dielectric material layer formed on the interfacial layer. An exemplary interfacial layer may be a grown silicon oxide layer formed by a thermal process or ALD process.

The gate electrode 206 is formed over the gate dielectric 204. In some embodiments, the gate electrode 206 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode 206 could include a conductive layer having a proper work function, therefore, the gate electrode 206 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrode layer 206 may include other conductive materials, such as aluminum, copper, tungsten, metal alloys, metal silicide, other suitable materials, or combinations thereof. For example, where the gate electrode 206 includes a work function layer, another conductive layer can be formed over the work function layer.

The hard mask 208 formed over the gate electrode 206 includes silicon oxide, silicon nitride, silicon oxynitride, silicon carbide, other suitable dielectric material, or combinations thereof. The hard mask 208 may have a multi-layer structure.

Figure 3:
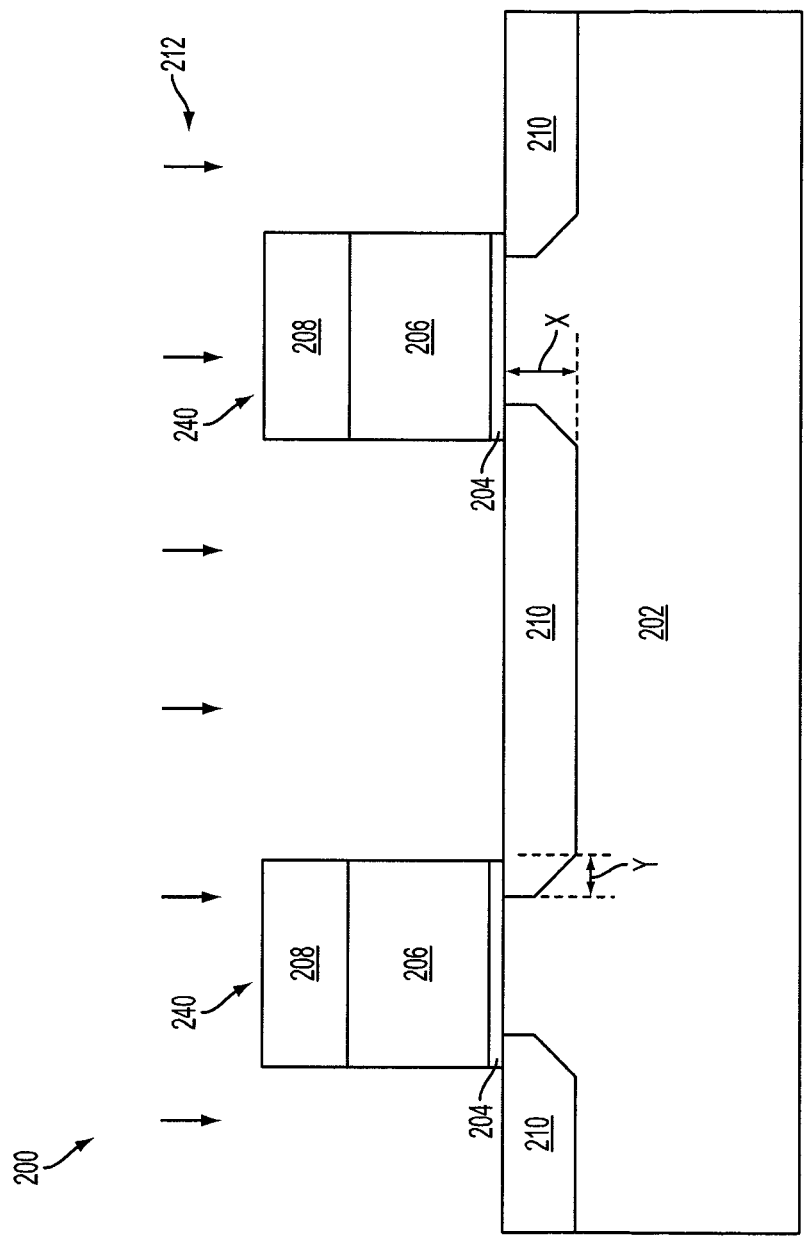

Referring to FIGS. 1 and 3, the method 100 continues with step 104 in which first doped regions 210 are formed in the substrate 202, interposed by the gate structures 240 by a first doping process 212. In some embodiments, the first doping process 212 includes a process of ion implantation, plasma based ion implantation, gaseous or solid source thermal diffusion, deposition, or combinations thereof. In one embodiment, the first doping process 212 introduces a first dopant, such as p-type dopant (boron and/or $BF_2$), in the first doped regions 210. In another embodiment, the first doping process 212 is performed using ion implantation or plasma based ion implantation process at an energy ranging from about 0.2 KeV to about 10 KeV. In other embodiment, the first doping process 212 is performed using ion implantation or plasma based ion implantation process with a dosage ranging between about 1E13 atoms/$cm^2$ and about 1E16 atoms/$cm^2$.

In one embodiment, portions of the first doped regions 210 are under the gate structures 240. In another embodiment, the portions of the first doped regions 210 under the gate structures 240 have a width Y less than about 5 nm. In some embodiments, the first doped regions 210 have a depth X ranging between about 5 nm and about 30 nm. The first doped regions 210 have a dopant profile consisting of an upper portion with a first dopant concentration and a lower portion with a second dopant concentration. In one embodiment, first dopant concentration is different from the second dopant concentration. In another embodiment, first dopant concentration is greater than the second dopant concentration. In other embodiment, the first doped regions 210 have a gradient concentration along the depth X, and the dopant concentration is decreasing from the top surface of the first doped regions 210 to the bottom surface of the first doped regions 210. For example, the dopant concentration at the top surface of the first doped regions 210 ranges between about 1E20 atoms/$cm^3$ and about 5E20 atoms/$cm^3$ and the dopant concentration at the bottom surface of the first doped regions 210 ranges between about 1E19 atoms/$cm^3$ and about 5E19 atoms/$cm^3$. In one embodiment, the first doped regions 210 have abrupt dopant profiles at the bottom surface as well as at the sidewalls. In another embodiment, the first doped regions 210 have abrupt profiles at the sidewalls with abruptness less than about 2-5 nm/decade.

Referring to FIG. 1, the method 100 continues with step 106 in which a first anneal process is provided to the substrate 202 for diffusion and/or activation of the first dopant in the first doped regions 210. In one embodiment, the first anneal process is performed at a temperature ranging between about 850° C. and about 1250° C. to form the desired dopant profile. In another embodiment, the first anneal process is performed under vacuum or an ambient of $N_2$ and/or $O_2$. In other embodiment, the first anneal process is lasting for a period of time ranging between about 1 μs and about 30 min.

Figure 4:
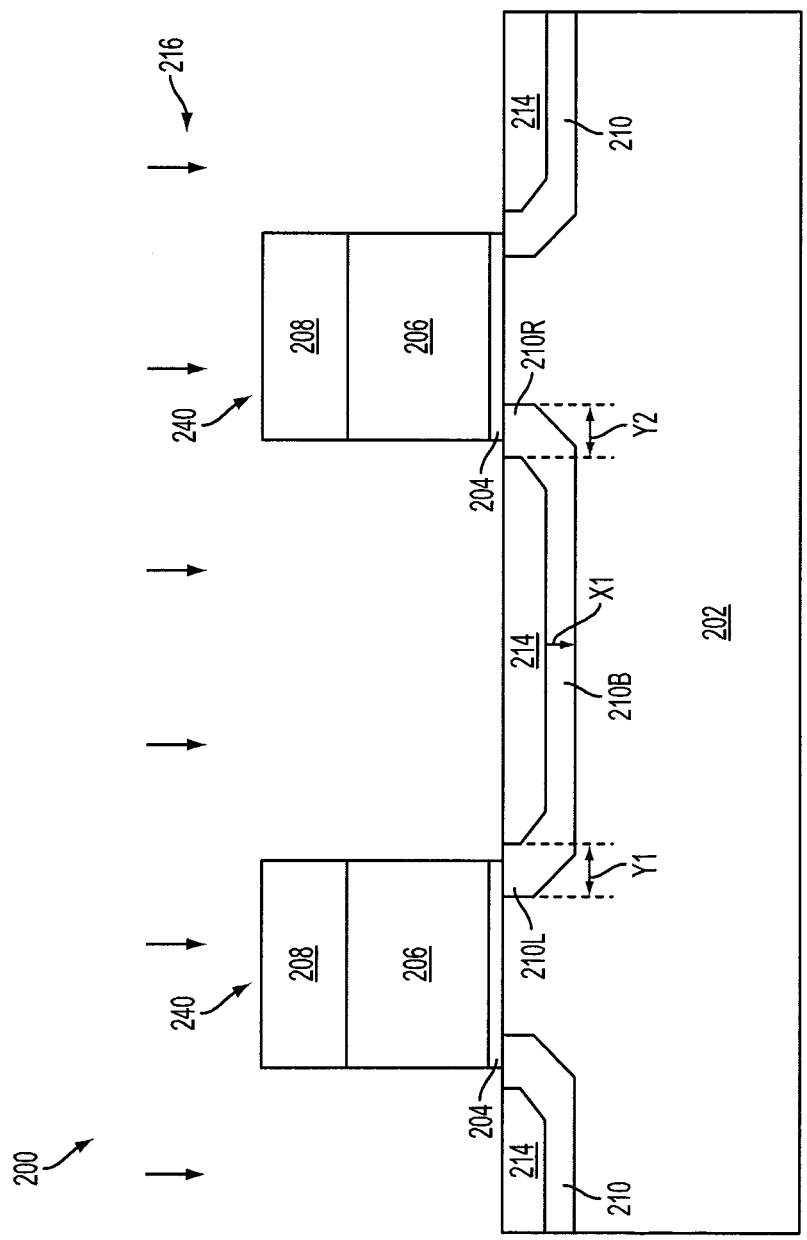

Referring to FIGS. 1 and 4, the method 100 continues with step 108 in which second doped regions 214 are formed in the substrate 202 by a second doping process 216. In one embodiment, each second doped region 214 is positioned within each of the first doped region 210. In another embodiment, each second doped region 214 is positioned at an upper portion of each first doped region 210. In another embodiment, each second doped region 214 has a top surface substantially aligned with the top surface of each of the first doped region 210 and has a bottom surface above the bottom surface of each of the first doped region 210. In one embodiment, the second doping process 216 includes a process of ion implantation, plasma based ion implantation, gaseous or solid source thermal diffusion, deposition, or combinations thereof. In another embodiment, the second doping process 216 is performed using an ion implantation process with an ion beam of a diverse angle ranging between about 0.2° to about 20° to control lateral distribution of the dopant. In other embodiment, the second doping process 216 is performed using an ion implantation process at an energy ranging between about 1 KeV and about 50 KeV.

In one embodiment, the second doping process 216 introduces a second dopant in the second doped regions 214, wherein the second dopant is different from the first dopant in the first doped regions 210. In another embodiment, the second doping process 216 introduces a second dopant with electrical carrier type opposite to the first dopant in the first doped regions 210, and has a dosage substantially the same as the dosage for forming the first doped regions 210, thereafter to form the second doped regions 214 with electrically neutral characteristics. In the depicted embodiment, since the first doped regions 210 are doped with p-type dopant, the second doped regions 214 are doped with n-type dopant, such as phosphorous or arsenic.

In one embodiment, the remaining first doped regions 210 which are not overlapped with the second doped regions 214 may be presented at periphery portions of the first doped regions 210, including a left portion 210L, a right portion 210R, and a bottom portion 210B. The bottom portion 210B have a depth X1, and the left portion 210L and the right portion 210R have widths Y1 and Y2, respectively. In some embodiments, the depth X1 is ranging between about 1 nm and about 10 nm. In one embodiment, the width Y1 and the width Y2 are ranging between about 2 nm and about 5 nm. In another embodiment, the width Y1 is substantially the same as the width Y2. The remaining first doped regions 210 and the second doped regions 214 may have different etching rates during a subsequent etching process because of the different doping species therein. For example, the remaining first doped regions 210 may have a lower etching rate because the first dopant (e.g., B) may retard the etching process. On the other hand, the second doped regions 214 may have a higher etching rate because the first dopant (e.g., B) are electrically neutralized by the opposite dopant (e.g., As) which may significantly reduce the retardation phenomenon during the etching process. As mentioned above, top surface of the left portion 210L and the right portion 210R has the first dopant (e.g., B) with dopant concentration ranging between about $1E20$ atoms/cm$^3$ and about $5E20$ atoms/cm$^3$ and bottom surface of the bottom portion 210B has the first dopant (e.g., B) with dopant concentration ranging between about $1E19$ atoms/cm$^3$ and about $5E19$ atoms/cm$^3$. Hence, the etching rate of the top surface of the left portion 210L and the right portion 210R may be significantly lower than the etching rate of the bottom surface of the bottom portion 210B due to concentration enhanced etching retardation.

Referring to FIG. 1, the method 100 continues with step 110 in which a second anneal process is provided to the substrate 202 for diffusion and/or activation of the n-type dopant in the second doped regions 214. In one embodiment, the second anneal process is performed at a temperature ranging between about 850° C. and about 1250° C. to form desired dopant profile. In another embodiment, the second anneal process is performed under vacuum or an ambient of $N_2$ and/or $O_2$. In other embodiment, the second anneal process is lasting for a period of time ranging between about 1 μs and about 30 min.

In one embodiment, the first and the second anneal processes can be merged to a single anneal process. For example, the single anneal process is provided after the first doping process 212 and the second doping process 216 under above-mentioned conditions to form desired dopant profiles. The single anneal process takes advantage of different dopant diffusion characteristics, e.g., fast diffusion for B and slower diffusion for As, to control the widths and depths of first doped regions 210 and second doped regions 214. In one embodiment, sequence of the first doping process 212 and the second doping process 216 can be reversed. For example, the second doping process 216 and the second anneal process are performed prior to the first doping process 212 and the first anneal process.

Figure 5:
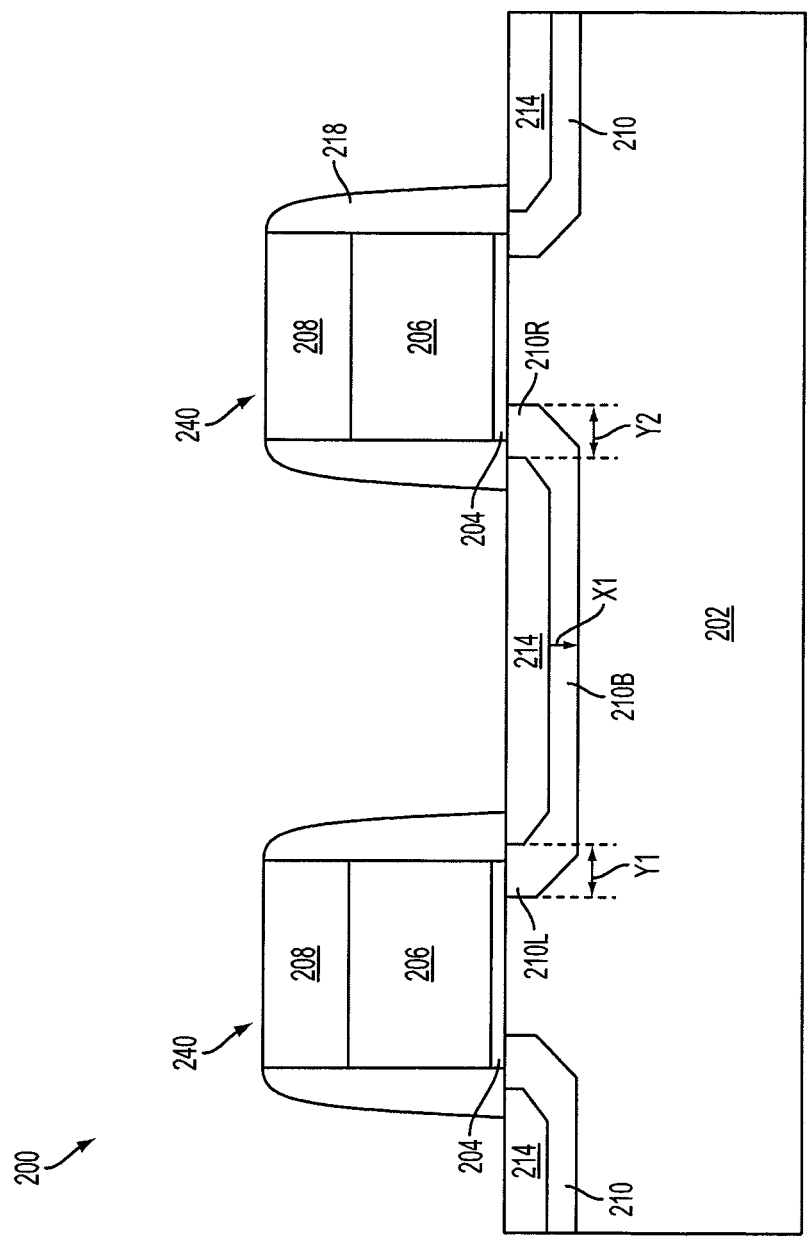

Referring to FIGS. 1 and 5, the method 100 continues with step 112 in which spacers are formed for the gate structures 240. In one embodiment, spacers 218 are formed overlying sidewalls of the gate structures 240 by a suitable process. For example, a dielectric layer, such as a silicon nitride layer, is deposited over the entire gate structures 240 and the substrate 202; and then, portions of the dielectric layer are removed by a dry etching process to form the spacers 218. The spacers 218 are positioned adjacent to the sidewalls of the gate structures 240 (gate dielectric 204, gate electrode 206, and hard mask 208). Alternatively, the spacers 218 include another dielectric material, such as silicon oxide, silicon carbide, silicon oxynitride, or combinations thereof. In another embodiment, liners (not shown) are formed between the spacers 218 and the gate structures 240 by a suitable process. The liners may also comprise another suitable dielectric material. During the dry etching process for forming the spacers 218, the first doped regions 210 and second doped regions 214 between the spacers 218 may be partially removed.

Figure 6:
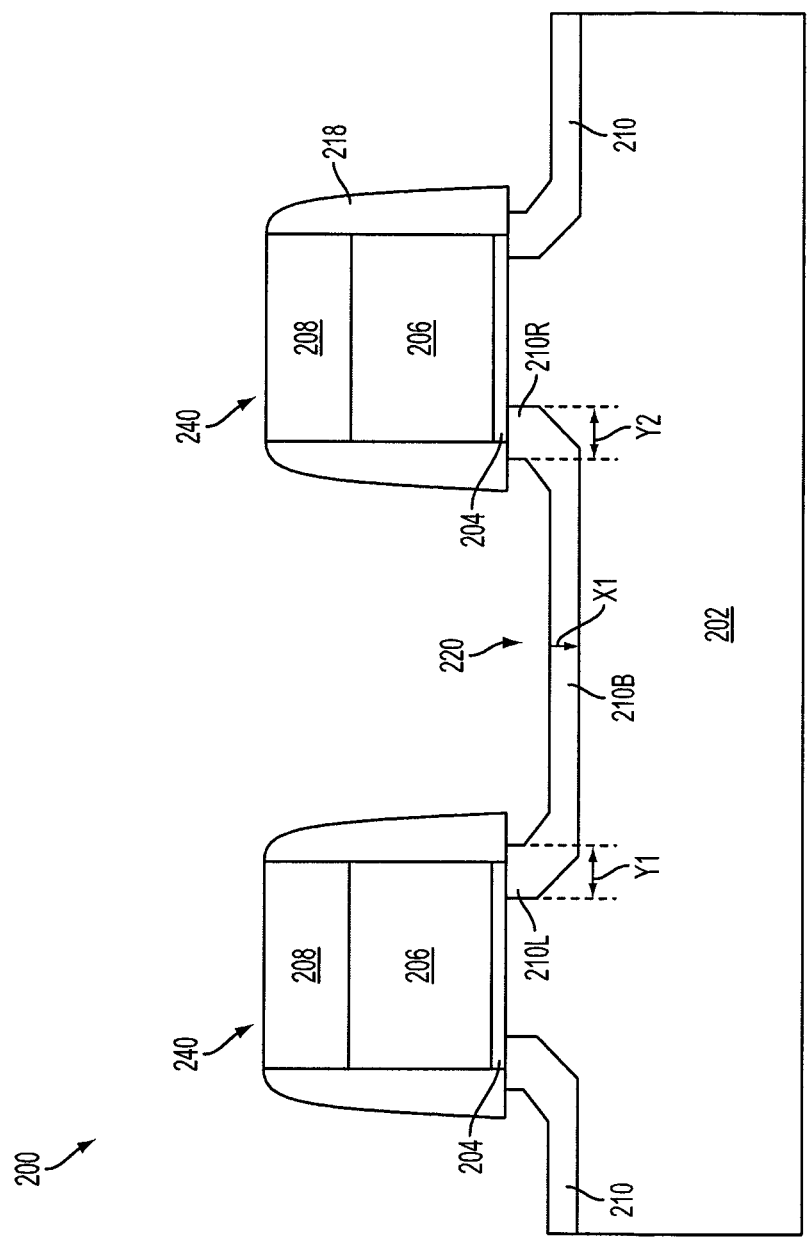

Referring to FIGS. 1 and 6, the method 100 continues with step 114 in which a first etching process is provided to remove portions of the substrate 202 at either side of the gate structure 240 to from recesses 220. In some embodiments, the first etching process includes a dry etching process, wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In the depicted embodiment, the first etching process utilizes a wet etching process. In one embodiment, the first etching process uses a chemical characterized as of high etching selectivity among regions with and without p-type dopant and low etching selectivity among different crystal facets. For example, the first etching process has a high etching rate to the second doped regions 214 because the p-type dopants are electrically neutralized by the n-type dopants, and the first etching process has a low etching rate to the first doped regions 210 because of the p-type dopant therein which may retard the etching process. In an example, the wet etching step may include the use of HF (hydrofluoric acid), $NH_4OH$, alkali hydroxide, EDP (ethylenediamine pyrocatechol), TMAH (tetramethylammonium hydroxide), other suitable wet etching solutions, or combinations thereof at a first temperature. The first temperature, for example, is about 10° C. to about 90° C. After the first etching process, a pre-cleaning process may be performed to clean the recesses 220 with a hydrofluoric acid (HF) solution or other suitable solution.

In the depicted embodiment, since the remaining first doped regions 210 (including the left portion 210L, the right portion 210R, and the bottom portion 210B) are doped with p-type dopant and the second doped regions 214 contain n-type and p-type dopants, the first etching process may remove the second doped regions 214 but stopping at the remaining first doped regions 210 at the periphery outside the second doped regions 214, which may be helpful for controlling the shapes of the recesses 220. Tight control in device performance is therefore can be achieved by staying the bottom portion 210B at the depth X1.

Figure 7:
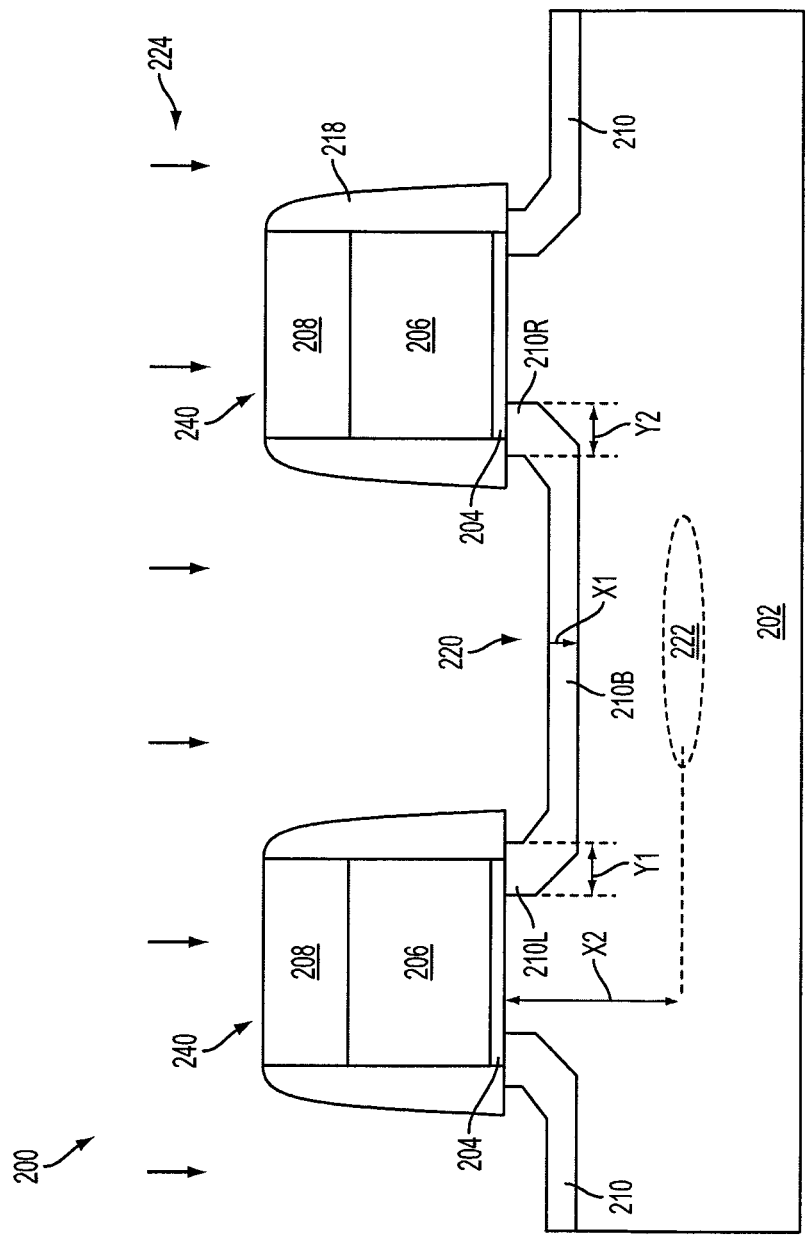

Referring to FIGS. 1 and 7, the method 100 continues with step 116 in which third doped regions 222 are formed by a third doping process 224. The third doped regions 222 may be positioned in the substrate 202 under the first doped regions 210. For example, the third doped regions 222 are away from the top surface of the substrate 202 with a distance X2, which is designed for a trench depth formed in a subsequent etching process. In some embodiments, the third doping process 224 includes a process of ion implantation, plasma based ion implantation, gaseous or solid source thermal diffusion, deposition or combinations thereof. In one embodiment, the third doping process 224 is performed using ion implantation process at an energy ranging between about 0.2 KeV and about 50 KeV. In another embodiment, the third doping process 224 is performed using ion doping implantation process with a dosage ranging between about $1E13$ atoms/cm$^2$ and about $1E16$ atoms/cm$^2$.

In some embodiments, the third doping process 224 introduces an impurity, such as C, B, N, O, F, $BF_2$, Si, Ge, P, As, He, Ar, or combinations thereof, to damage crystalline structure and/or place the impurity atoms in the third doped regions 222. The third doping process 224 may modify etching rate of the third doped regions 222 and makes the third doped regions 222 functioning as a vertical etching stop layer during the subsequent etching process for forming a trench structure. For example, the third doping process 224 introduces a certain amount of damage to crystalline structure of the third doped regions 222 to decrease its etching rate by a certain percentage required for trench depth reaching to the distance X2 and the lateral expansion of regions 210L and 210R staying within a desired process window. The effect from the third doping process 224 may also be achieved by placing the impurity atoms in the third doped regions 222 to retard the etching process in the third doped regions 222, which may be helpful for controlling the overall shape of the recess.

Referring to FIG. 1, the method 100 continues with step 118 in which a third anneal process is provided to the substrate 202 for placing the third dopant to desirable locations and/or repairing the damage in the third doped regions 222. In one embodiment, the third anneal process is performed at a temperature ranging between about 850° C. and about 1250° C. In another embodiment, the third anneal process is performed under vacuum or an ambient of N and/or $O_2$. In other embodiment, the third anneal process is lasting for a period of time ranging between about 1 µs and about 30 min. The third anneal process may be omitted if the modification of etching rate is caused by damaging crystalline structure of the third doped regions 222, instead of the retardation effect from dopant atoms.

Figure 8:
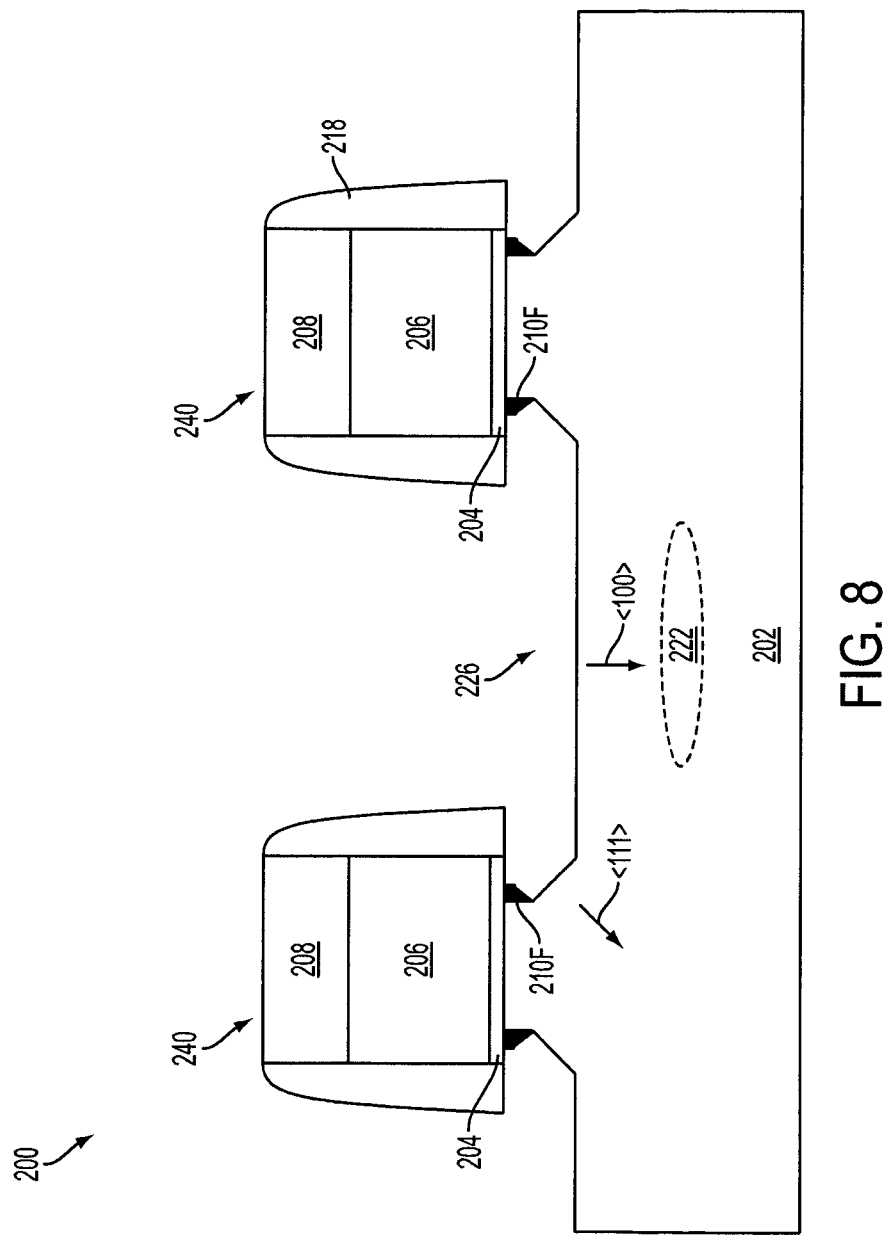

Referring to FIGS. 1 and 8, the method 100 continues with step 120 in which a second etching process is provided to remove portions of the substrate at either side of the gate structure 240 to from recesses 226. In some embodiments, the second etching process includes a dry etching process, wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In the depicted embodiment, the second etching process utilizes a wet etching process. In another embodiment, the second etching process uses a chemical characterized as with capability to remove a region with less p-type dopant. For example, the second etching process may remove a portion of the remaining first doped regions 210 with dopant concentration below a certain level (e.g., the concentration of boron and/or $BF2<5E19$ atoms/cm$^3$), but leave alone the portion of the remaining first doped regions 210 with higher dopant concentration (e.g., the concentration of B and/or $BF2>5E19$ atoms/cm$^3$). In other embodiment, the second etching process uses a chemical characterized as of high etching selectivity along different crystal orientations. For example, the second etching process may provide an etching rate in <111> direction much slower than an etching rate in <100> direction, thereby removing the bottom portion 210B.

In an example, the second etching process may include the use of HF (hydrofluoric acid), $NH_4OH$, alkali hydroxide, EDP (ethylenediamine pyrocatechol), TMAH (tetramethylammonium hydroxide), other suitable wet etching solutions, or combinations thereof at a second temperature. In one embodiment, the second temperature may be lower than the first temperature used in the first etching process. In another embodiment, the second temperature is ranging between about 10° C. and about 60° C. After the second etching process, a pre-cleaning process may be performed to clean the recesses 226 with a suitable solution such as diluted hydrofluoric acid (HF).

In the depicted embodiment, top portions of the left portion 210L and the right portion 210R are located at the desired positions in relative to the gate structure 240 to deliver a self-aligned property. Variations in width and pitch distance of the gate structure 240 as well as variations in width of spacer 218 have no impact to the relative position of trench sidewalls defined by 210L and 210R to gate structure 240. The crystal facets 210F formed after the second etching process are typically (111) planes according to a cross-sectional view of the semiconductor device 200. (From a top view, the remaining top portion of the left portion 210L and the right portion 210R is a periphery of the first doped region.) The facets 210F may function as a lateral etch stop during the subsequent etching process for forming a trench, which may be helpful for controlling the shapes of the trench.

Referring to FIGS. 1 and 9, the method 100 continues with step 122 in which a third etching process is provided to remove portions of the substrate 202 at either side of the gate structure 240 to enlarge and re-shape the recesses 226 to form trenches 228. The trenches 228 are formed in source and drain regions of the semiconductor device 200. In some embodiments, the trenches 228 include tips 230 under the gate structures 240. In some embodiments, the third etching process includes a dry etching process, wet etching process, or combination thereof. In the depicted embodiment, the third etching process utilizes a wet etching process. In another embodiment, the third etching process uses a chemical having a proper etching selectivity among different crystal orientations. For example, the third etching process may provide a preferred ratio of an etching rate in <111> direction to an etching rate in <100> direction, thereby forming the trenches 228 with desired shape (e.g., position of the tips 230 and/or depth of the trenches 228). As mentioned above, the desired depth of the trenches 228 should reach the target depth X2 of the third doped region 222 for different width and pitch distance of gate structures 240. In an example, the third etching process may include the use of HF (hydrofluoric acid), $NH_4OH$, alkali hydroxide, EDP (ethylenediamine pyrocatechol), TMAH (tetramethylammonium hydroxide), other suitable wet etching solutions, or combinations thereof at a third temperature. In one embodiment, the third temperature may be same or different from the second temperature used in the second etching process. In another embodiment, the third temperature is ranging between about 10° C. and about 60° C. After the third etching process, a pre-cleaning process may be performed to clean the trenches 228 with a suitable solution such as diluted hydrofluoric acid (HF).

Referring to FIGS. 1 and 10, the method 100 continues with step 124 in which a semiconductor material is formed in the trenches 228 to form source and drain features 232 with or without built-in strain to complete the construction of the semiconductor device 200. In the depicted embodiment, an epitaxy or epitaxial (epi) process is performed to form the semiconductor material in the trenches 228. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 202. The source and drain features 232 may include epitaxially grown silicon (epi Si) for a NFET device in the semiconductor device 200, wherein the epi Si may be undoped or doped with n-type dopants such as phosphorous. The source and drain features 232 may include epitaxially grown silicon germanium (epi SiGe) for a PFET device in the semiconductor device 200, wherein the epi SiGe may be undoped or doped with p-type dopants such as boron.

Thereafter, the semiconductor 200 continues with processing to complete fabrication as discussed briefly below. For example, an inter-level dielectric (ILD) layer is formed on the substrate and a chemical mechanical polishing (CMP) process is further applied to the substrate to planarize the substrate. Further, a contact etch stop layer (CESL) may be formed on top of the gate structures 240 before forming the ILD layer. In an embodiment, the gate electrode 206 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal e.g., p-type work function metal and n-type work function metal for the PFET devices and the NFET devices.

A multilayer interconnection (MLI) including metal layers and inter-metal dielectric (IMD) is formed over the substrate to electrically connect various features or structures of the semiconductor device. The multilayer interconnection includes vertical interconnects, such as vias or contacts, and horizontal interconnects, such as metal lines. The various interconnection features may implement various conductive materials including copper, tungsten and silicide. In one example, a damascene process is used to form copper multilayer interconnection structure.

In summary, the disclosed methods and integrated circuit devices result in improved device performance, including but not limited to, improved control over critical dimensions of the recess trenches for forming the source and drain features. Further, a photoresist and/or hard mask features may be omitted during the formation of the recesses or trenches, which may simplify the process flow and reduce the cost for forming the semiconductor device. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure over a substrate;
   forming a doped region in the substrate adjacent to the gate structure, wherein the doped region comprises a second doped region surrounded by a first doped region, wherein the first doped region has an upper portion with a first dopant concentration and a lower portion with a second dopant concentration, the first dopant concentration being different from the second dopant concentration;
   removing the second doped region, wherein the step of removing the second doped region stops on the first doped region;
   removing at least a portion of the first doped region while leaving an edge portion of the first doped region, thereby forming a recess in the substrate that defines a source and drain region in the substrate; and
   epitaxially (epi) growing a semiconductor material to fill the recess, thereby forming a source and drain feature.

2. The method of claim 1, wherein the first doped region is formed by an ion implantation or plasma based ion implantation process to introduce a p-type dopant therein.

3. The method of claim 2, further comprising:
   performing a first anneal process after the ion or plasma based ion implantation, wherein the first anneal process is performed under vacuum or an ambient of $N_2$ or $O_2$ at a temperature ranging between about 850° C. and about 1250° C.

4. The method of claim 1, wherein the first dopant concentration is greater than the second dopant concentration.

5. The method of claim 4, wherein the first dopant concentration is ranging between about 1E20 atoms/$cm^3$ and about 5E20 atoms/$cm^3$.

6. The method of claim 4, wherein the second dopant concentration is ranging between about 1E19 atoms/$cm^3$ and about 5E19 atoms/$cm^3$.

7. The method of claim 1, wherein the second doped region is formed by an ion implantation or plasma based ion implantation process with a diverse beam to introduce an n-type dopant therein.

8. The method of claim 7, further comprising:
   performing a second anneal process after the ion implantation or plasma based ion implantation process, herein the second anneal process is performed under vacuum or an ambient of $N_2$ or $O_2$ at a temperature ranging between about 850° C. and about 1250° C.

9. The method of claim 1, further comprising:
   forming a third doped region under the first doped region by introducing an impurity therein; and
   etching a portion of the substrate over the third doped region using the third doped region as an etch stop layer.

10. The method of claim 9, wherein the impurity includes at least one of C, B, N, O, F, $BF_2$, Si, Ge, P, As, He, or Ar.

11. The method of claim 9, wherein the impurity is introduced by an ion implantation process with a dosage ranging between about 1E13 atoms/$cm^2$ and about 1E16 atoms/$cm^2$.

12. The method of claim 9, wherein the third doped region is spaced apart from the first doped region by a portion of the substrate.

13. The method of claim 1, wherein said removing the second doped region is performed by a first wet etching process using at least one of HF, $NH_4OH$, alkali hydroxide, EDP, or TMAH, at a first temperature ranging between about 10° C. and about 90° C.

14. The method of claim 13, wherein said removing the portion of the first doped region is performed by a second wet etching process using at least one of HF, $NH_4OH$, alkali hydroxide, EDP, or TMAH, at a second temperature ranging between about 10° C. and about 60° C., wherein the second temperature is lower than the first temperature.

15. The method of claim 1, further comprising:
   performing a third wet etching process to enlarge the recess before said epi growing the semiconductor material.

16. The method of claim 15, wherein the third wet etching process is performed by using at least one of HF, $NH_4OH$, alkali hydroxide, EDP, or TMAH, at a third temperature ranging between about 10° C. and about 60° C.

17. The method of claim 1 further comprising forming a gate spacer on a sidewall of the gate structure, wherein after the step of removing the second doped region, a portion of the second doped region underlying the gate spacer is removed.

18. The method of claim 17, wherein after the step of removing the second doped region, substantially an entirety of the second doped region is removed.

19. The method of claim 18, wherein after the step of removing the second doped region, an entirety of the second doped region underlying the gate spacer is removed.

20. A method, comprising:
  forming a gate structure over a substrate;
  forming a first doped region with a first dopant in the substrate and adjacent to the gate structure, wherein the first doped region has an upper portion with a first dopant concentration and a lower portion with a second dopant concentration, the first dopant concentration being greater than the second dopant concentration;
  forming a second doped region with a second dopant in the substrate and within the first doped region;
  forming spacers overlying sidewalls of the gate structure;
  performing a first wet etching process to remove the second doped region;
  performing a second wet etching process to remove a middle portion of the first doped region while leaving a periphery portion of the first doped region, thereby forming a recess in the substrate;
  forming a third doped region in the substrate and under the first doped region;
  performing a third wet etching process to form a trench by enlarging the recess, wherein the trench defines a source and drain region in the substrate; and
  epitaxially (epi) growing a semiconductor material to fill the trench, thereby forming a source and drain feature.

21. The method of claim 20, wherein the first doped region is formed by an ion implantation or plasma based ion implantation process with a dosage ranging between about 1E13 atoms/cm2 and about 1E16 atoms/cm2 and at an energy ranging from about 0.2KeV to about 10 KeV to introduce the first dopant being a p-type dopant therein.

22. The method of claim 20, wherein the second doped region is formed by an ion implantation or plasma based ion implantation process with a diverse beam of incident angles ranging between 0.2° and about 20° to introduce the second dopant being an n-type dopant therein.

23. The method of claim 20, wherein the first, second, and third wet etching processes are performed at a first temperature, a second temperature, and a third temperature, respectively, and the first temperature is greater than the second temperature.

24. The method of claim 20, further comprising:
  performing an anneal process after said forming the second doped region, wherein the anneal process is performed under vacuum or an ambient of N2 or O2, at a temperature ranging between about 850° C. and about 1250° C.

25. A method, comprising:
  providing a semiconductor substrate;
  forming a gate structure over the substrate;
  performing a plasma based ion implantation process to introduce a p-type dopant in the substrate, thereby forming a first doped region having an upper portion and a lower portion, wherein a doping concentration of the p-type dopant in the upper portion is greater than a doping concentration of the p-type dopant in the lower portion;
  performing a first anneal to the substrate to activate the p-type dopant;
  performing an ion implantation process to introduce an n-type dopant in the first doped region, thereby forming a second doped region;
  performing a second anneal to the substrate to activate the n-type dopant;
  forming spacers overlying sidewalls of the gate structure;
  removing the second doped region by a first wet etching process,
  forming a third doped region in the substrate and under the first doped region;
  removing a middle portion of the first doped region, while leaving a periphery portion of the first doped region by a second wet etching process, thereby forming a recess;
  enlarging the recess by a third wet etching process to from a trench that defines a source and drain region in the substrate; and
  epitaxially (epi) growing a semiconductor material to fill the trench, thereby forming a source and drain feature.

* * * * *